(12) United States Patent
Cho

(10) Patent No.: US 7,978,548 B2
(45) Date of Patent: Jul. 12, 2011

(54) BLOCK DECODING CIRCUITS OF SEMICONDUCTOR MEMORY DEVICES AND METHODS OF OPERATING THE SAME

(75) Inventor: Yong-ho Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 255 days.

(21) Appl. No.: 12/320,625

(22) Filed: Jan. 30, 2009

(65) Prior Publication Data

US 2009/0196112 A1    Aug. 6, 2009

(30) Foreign Application Priority Data

Jan. 31, 2008  (KR) ................ 10-2008-0010287

(51) Int. Cl.
*G11C 29/00* (2006.01)
(52) U.S. Cl. ............... 365/200; 365/230.06; 365/230.03
(58) Field of Classification Search .......... 365/200, 365/230.06, 230.03, 185.09, 185.11, 185.18, 365/201, 63, 189.01, 185.23, 185.22, 191
See application file for complete search history.

(56) References Cited

U.S. PATENT DOCUMENTS

2009/0003118 A1*  1/2009  Yoo ............... 365/230.03
2009/0168570 A1*  7/2009  Park .................. 365/200

FOREIGN PATENT DOCUMENTS

| JP | 2001-035184 | 2/2001 |
| KR | 10-1999-0079136 | 11/1999 |
| KR | 10-2000-0045904 | 7/2000 |
| KR | 10-2000-0061317 | 10/2000 |

* cited by examiner

*Primary Examiner* — Dang T Nguyen
(74) *Attorney, Agent, or Firm* — Harness, Dickey & Pierce, PLC

(57) ABSTRACT

A block decoding circuit of a semiconductor memory device includes a plurality of block decoders, a plurality of repair address check circuits, a dummy repair address check circuit and a block selection signal generation circuit. The plurality of block decoders are configured to decode a received block selection address. The plurality of repair address check circuits are configured to generate second output signals based on whether a received block selection address and word line selection address are repair addresses. The dummy repair address check circuit is configured to generate a control signal in response to the block selection address and the word line selection address. The block selection signal generation circuit is configured to generate block selection signals based on the first output signals from the plurality of block decoders, the control signal from the dummy repair address circuit, and the second output signals from the repair address check circuits.

20 Claims, 3 Drawing Sheets

BLOCK DECODING CIRCUITS OF SEMICONDUCTOR MEMORY DEVICES AND METHODS OF OPERATING THE SAME

PRIORITY STATEMENT

This application claims priority under 35 U.S.C. §119 to Korean Patent Application No. 10-2008-0010287, filed on Jan. 31, 2008, in the Korean Intellectual Property Office, the entire contents of which are incorporated herein by reference.

BACKGROUND

Description of the Related Art

A semiconductor memory device includes a memory cell array for storing data. Generally, a conventional memory cell array is divided into a plurality of normal memory cell array blocks according to a data selection structure, operating speed, and/or layout area. If a defective memory cell exists in the plurality of normal memory cell array blocks, the semiconductor memory device may be unable to operate normally. A semiconductor memory device that is unable to operate normally is considered defective. Accordingly, conventional semiconductor memory devices include a repair memory cell array block formed of repair memory cells, which repair a defective memory cell in the normal memory cell array blocks that is found during testing.

Conventional semiconductor memory devices also include a row address decoding circuit and a column address decoding circuit to decode an address of the memory cell array.

FIG. 1 is a block diagram for illustrating a conventional row address decoding circuit of a semiconductor memory device, such as a dynamic random access memory (DRAM).

As illustrated in FIG. 1, the conventional row address decoding circuit is formed of a block decoder unit 100 and a word line decoder unit 110. The word line decoder unit 110 is enabled by an output signal of the block decoder unit 100. The block decoder unit 100 not only decodes the normal memory cell array blocks, but also determines whether an input row address is a repair address, thereby determining whether to enable a normal word line of the normal memory cell array blocks or to enable a repair word line of the repair memory cell array block according to a result of the determination.

Referring to FIG. 1, the block decoder unit 100 includes a plurality of block decoders B11 through B14, and a plurality of repair address check circuits R11 through R14. The block decoders B11 through B14 receive and decode a block selection address BDRA. The repair address check circuits R11 through R14 receive the block selection address BDRA and a word line selection address WDRA. The repair address check circuits R11 through R14 check whether the received block selection address BDRA and the word line selection address WDRA are repair addresses, which refer to the repair memory cell array block. Output signals of the repair address check circuits R11 through R14 are applied to gates of pull-down n-type metal-oxide-semiconductor (NMOS) transistors N11 through N14 whose drains are commonly connected to a repair discrimination signal PRREB line.

Conventionally, a repair address discrimination performed by the repair address check circuits R11 through R14 requires more time than a block decoding performed by the block decoders B11 through B14. Thus, delayers or delay units D11 through D14 are added to output terminals of the block decoders B11 through B14 so that output signals of the block decoders B11 through B14 arrive later at AND gates A11 through A14 than a repair discrimination signal PRREB, from a reference time in which the block selection address BDRA is input to the block decoders B11 through B14. The AND gates A11 through A14 are controlled by the repair discrimination signal PRREB, and receive output signals BS1 through BSn output from the block decoders B11 through B14 and delayed by the delayers D11 through D14, thereby generating block selection signals BS11 through BS1$n$.

Generally, the delayers D11 through D14 are formed of an inverter having a relatively long channel length, a resistor R, and a capacitor C. A delay time of the delayers D11 through D14 has to be determined by considering a maximum delay difference between the output signal BS1 and the repair discrimination signal PRREB. For example, a case has to be considered in which the output signal BS1 of the first block decoder B11 is generated in a waveform direction of the block selection address BDRA, and the repair discrimination signal PRREB is generated by the last repair address check circuit R14.

A time skew between the block selection address BDRA and the word line selection address WDRA also has to be considered. Not only the block selection address BDRA, but also the word line selection address WDRA, is input to the repair address check circuits R11 through R14, thus a speed of the repair discrimination signal PRREB is controlled by a slower one of the block selection address BDRA and the word line selection address WDRA. However, only the block selection address BDRA is input to the block decoders B11 through B14. Thus, the time skew between the block selection address BDRA and the word line selection address WDRA also must be considered.

The fact that the repair address check circuits R11 through R14 are different from the block decoders B11 through B14 in view of a structure of a circuit and a device must also be considered.

In this regard, even if the delay time of the delayers D11 through D14 is determined by considering the above factors with respect to a block decoding circuit (e.g., the block decoder unit 100 of FIG. 1), the operating speed may be hindered or malfunctions may occur due to a delay characteristic mismatch between the delayers D11 through D14 and the repair address check circuits R11 through R14. Also, a chip size may increase because the delayers D11 through D14 are added to the output terminals of the block decoders B11 through B14.

SUMMARY

Example embodiments relate to semiconductor memory devices, for example, block decoding circuits of semiconductor memory devices.

Example embodiments provide block decoding circuits of semiconductor memory devices. Block decoding circuits according to example embodiments may be capable of reducing the effects of delay characteristic mismatch between delayers or delay units and repair address check circuits, and/or reducing chip size by suppressing and/or eliminating the need for delayers to be added to output terminals of block decoders.

At least one example embodiment provides a block decoding circuit of a semiconductor memory device. According to at least this example embodiment, the block decoding circuit may include a plurality of block decoders configured to receive and decode a block selection address. The block decoding circuit may further include a plurality of repair address check circuits configured to receive the block selection address and a word line selection address. The plurality of repair address circuits may check whether the block selection address and the word line selection address are repair addresses. Still further the block decoding circuit may include a dummy repair address check circuit and a block selection signal generation circuit. The dummy repair address check circuit may receive the block selection address and the word line selection address, and generate a control signal. The block selection signal generation circuit may receive output signals of the block decoders in response to the control signal, and output the received output signals of the block decoders as block selection signals in response to output signals of the repair address check circuits.

According to at least some example embodiments, the dummy repair address check circuit may have the same or substantially the same structure as the repair address check circuits. When the block selection address and the word line selection address are input, the dummy repair address check circuit may be formed to always or constantly enable the control signal to logic high regardless or independent of whether the input block selection address and the word line selection address are repair addresses or not. The dummy repair address check circuit may be disposed or arranged in the vicinity of or near a last repair address check circuit. The last repair address check circuit may be connected at a position that is the farthest from an input point at which the block selection address and the word line selection address are input.

According to at least some example embodiments, the block selection signal generation circuit may include a first transistor (e.g., pull-down n-type metal-oxide-semiconductor (NMOS) transistor) having a drain connected to a block selection enable signal line and a gate to which the control signal generated by the dummy repair address check circuit is applied. The block selection signal generation circuit may further include a plurality of first AND gates and plurality of second transistors (e.g., pull-down NMOS transistors). The plurality of first AND gates may be configured to receive corresponding output signals from among the output signals of the block decoders, and an inverted signal of a block selection enable signal. The plurality of second transistors may have drains respectively connected to a repair discrimination signal line, gates to which a corresponding output signal from among the output signals of the repair address check circuits are applied, and sources to which a ground voltage is applied. Still further, the block selection signal generation circuit may further include a plurality of second AND gates configured to receive a corresponding output signal from among output signals of the first AND gates and a repair discrimination signal, thereby outputting the block selection signals. A load of the block selection enable signal line may be the same or substantially the same as a load of the repair discrimination signal line.

At least one other example embodiment provides a block decoding circuit of a semiconductor memory device. According to at least this example embodiment, each of a plurality of block decoders may be configured to decode a received block selection address and generate a first output signal corresponding to the received block selection address. Each of a plurality of repair address check circuits may be configured to generate a second output signal based on whether a received block selection address and word line selection address are repair addresses. A dummy repair address check circuit may be configured to generate a control signal in response to the block selection address and the word line selection address. A block selection signal generation circuit may be configured to generate block selection signals based on the first output signals from the plurality of block decoders, the control signal from the dummy repair address circuit, and the second output signals from the repair address check circuits.

According to at least some example embodiments, if the block selection address and the word line selection address are repair addresses the block selection signal generation circuit may be further configured to deactivate the block selection signals, and select a repair word line. The block selection signal generation circuit may select the repair word line by activating a repair block selection signal input to the repair word line.

At least one other example embodiment provides a method of operating a block decoding circuit of a semiconductor memory device. According to at least this example embodiment, at each of a plurality of block decoders, a received block selection address may be decoded and a first output signal corresponding to the received block selection address may be generated. At each of a plurality of repair address check circuits, a second output signal may be generated based on whether a received block selection address and word line selection address are repair addresses. At a dummy repair address check circuit, a control signal may be generated in response to the block selection address and the word line selection address. At a block selection signal generation circuit, block selection signals may be generated based on the first output signals from the plurality of block decoders, the control signal from the dummy repair address circuit, and the second output signals from the repair address check circuits.

According to at least some example embodiments, wherein the control signal is activated regardless of whether the input block selection address and the word line selection address are repair addresses. Each of the second output signals may be disabled when the block selection address and the word line selection address are not repair addresses, but enabled when the block selection address and the word line selection address are repair addresses. The block selection signals may be activated and a repair block selection signal may be deactivated when the block selection address and the word line selection address are not repair addresses. The block selection signals may be deactivated and a repair block selection signal for selecting a repair word line may be activated in response to an enabled second output signal from the repair address check circuits when the block selection address and the word line selection address are repair addresses.

According to at least some example embodiments, the block selection signals may be deactivated, and a repair word line may be selected if the block selection address and the word line selection address are repair addresses. The repair word line may be selected by activating a repair block selection signal input to the repair word line.

BRIEF DESCRIPTION OF THE DRAWINGS

The above and other features and advantages of the present invention will become more apparent by describing in detail example embodiments thereof with reference to the attached drawings in which.

DETAILED DESCRIPTION OF EXAMPLE EMBODIMENTS

Figure 1:
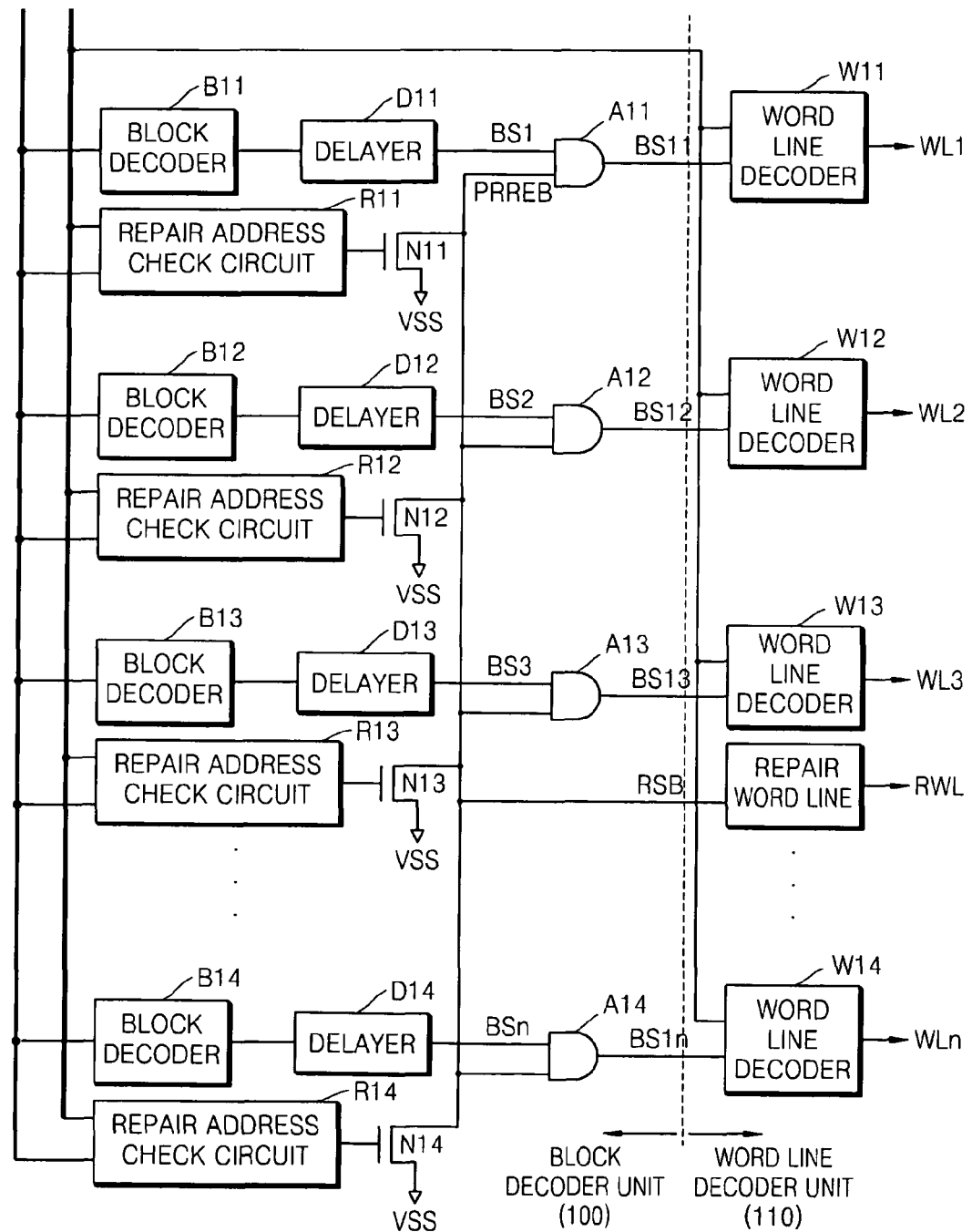
FIG. 1 is a block diagram for illustrating a conventional row address decoding circuit of a semiconductor memory device.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
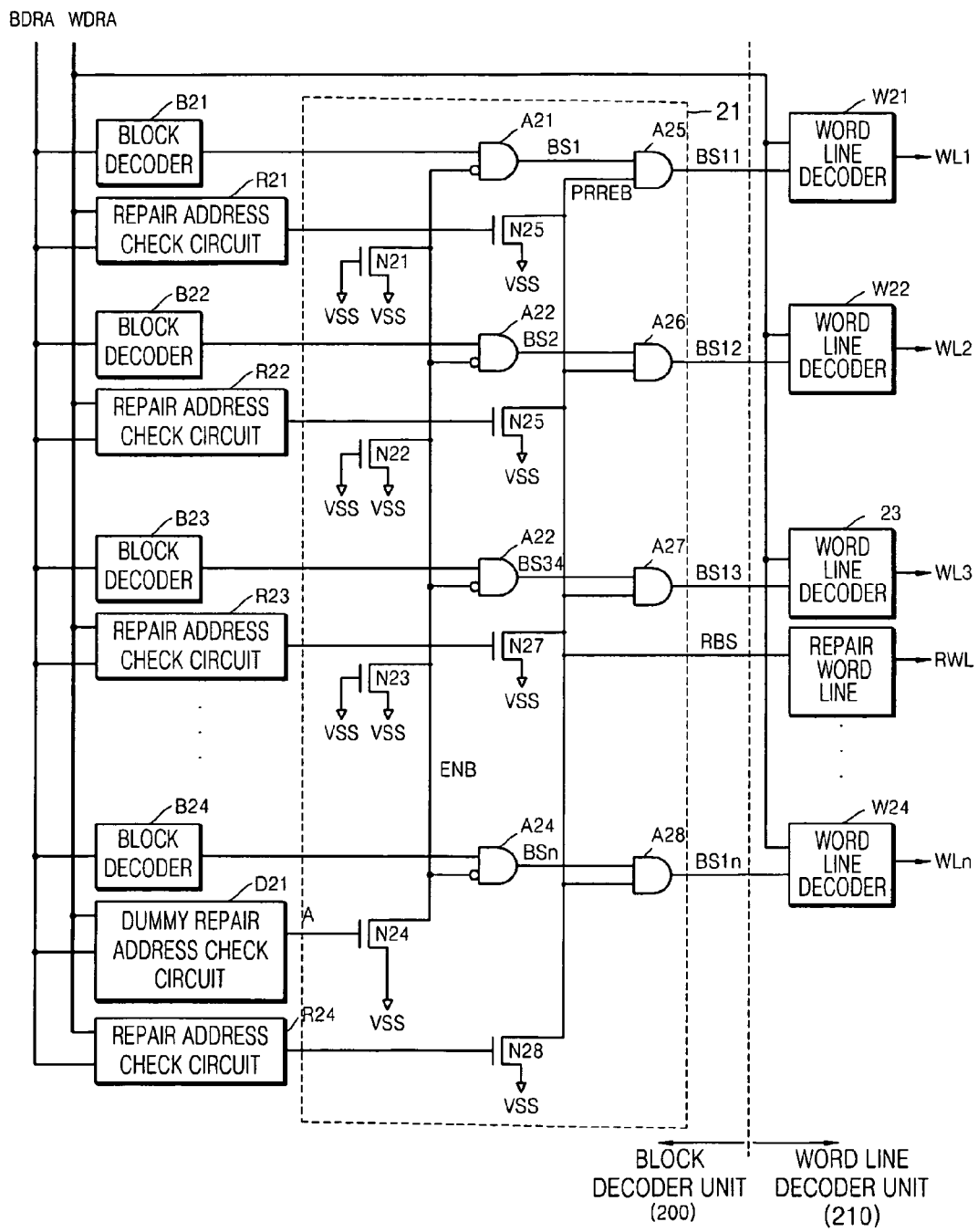
FIG. 2 is a block diagram for illustrating a block decoding circuit of a semiconductor memory device according to an example embodiment.

FIG. 2 is a block diagram for illustrating a block decoding circuit 200 of a semiconductor memory device according to an example embodiment. For convenience of description, a word line decoding circuit 210 is also illustrated in FIG. 2.

Referring to FIG. 2, the block decoding circuit 200 according to at least this example embodiment includes a plurality of block decoders B21 through B24, a plurality of repair address check circuits R21 through R24, a dummy repair address check circuit D21, and a block selection signal generation circuit 21.

The block decoders B21 through B24 may receive and decode one or more (e.g., respective) block selection addresses BDRA (hereinafter referred to in some cases as block selection address BDRA). The repair address check circuits R21 through R24 may receive the block selection addresses BDRA and one or more (e.g., respective) word line selection addresses WDRA (hereinafter referred to in some cases as word line selection address WDRA). The repair address check circuits R21 through R24 may check whether the received block selection address BDRA and word line selection address WDRA are repair addresses, which refer to a repair or redundant memory cell array block. If the block selection address BDRA and the word line selection address WDRA are not repair addresses, the repair address check circuits R21 through R24 may disable their output signals, for example, by switching to logic low. If the block selection address BDRA and the word line selection address WDRA are repair addresses, the repair address check circuits R21 through R24 may enable their output signals, for example, by switching to logic high.

The dummy repair address check circuit D21 may also receive the block selection address BDRA and the word line selection address WDRA. The dummy repair address check circuit D21 may generate a control signal A having a first logic level (e.g., a logic high), regardless (or independent) of whether the input block selection address BDRA and the word line selection address WDRA are repair addresses.

To account for a situation in which the first block decoder B21 generates an output signal and the last repair address check circuit R24 generates a repair discrimination signal PRREB, the dummy repair address check circuit D21 may be disposed or arranged in the vicinity of (near) the last repair address check circuit R24 because of the delay difference between an output signal BS1 and the repair discrimination signal PRREB. For example, the last repair address check circuit R24 may be connected at a position that is further than any other repair address check circuit from a point at which the block selection address BDRA and the word line selection address WDRA are input. The dummy repair address check circuit D21 may be formed to be as similar as possible, for example, the same or substantially the same as the repair address check circuits R21 through R24.

The block selection signal generation circuit 21 may receive output signals BS1 through BSn of the block decoders B21 through B24 in response to the control signal A generated by the dummy repair address check circuit D21. The block selection signal generation circuit 21 may output block selection signals BS11 through BS1n based on output signals from the repair address check circuits R21 through R24.

In the case where the block selection address BDRA and the word line selection address WDRA are not repair addresses, the output signals from the repair address check circuits R21 through R24 may be in a disabled state (e.g., a logic low). In this example, the block selection signal generation circuit 21 may output the received output signals BS1 through BSn from the block decoders B21 through B24 as block selection signals BS11 through BS1n in response to the output signals from the repair address check circuits R21 through R24.

In the case where the block selection address BDRA and the word line selection address WDRA are repair addresses, the block selection signal generation circuit 21 may deactivate all of the block selection signals BS11 through BS1n, and activate (active low) a repair block selection signal RBS for selecting a repair word line corresponding to an enabled output signal from one of the repair address check circuits R21 through R24 (e.g., repair address circuit R23 in FIG. 2).

The block selection signal generation circuit 21 may include a plurality of first AND gates A21 through A24, a plurality of second AND gates A25 through A28, a plurality of first pull-down (e.g., n-type) metal-oxide-semiconductor (NMOS) transistors N21 through N24, and a plurality of second pull-down (e.g., NMOS) transistors N25 through N28. Although discussed herein with respect to NMOS transistors, p-type MOS (PMOS) or similar transistors may be used.

Drains of each of the first pull-down NMOS transistors N21 through N24 may be commonly connected to a block selection enable signal ENB line. The control signal A generated by the dummy repair address check circuit D21 may be input to a gate of the first pull-down NMOS transistor N24. A ground voltage VSS may be applied to gates of the first pull-down NMOS transistors N21 through N23, and thus, the first pull-down NMOS transistors N21 through N23 may always be turned-off.

Drains of each of the second pull-down NMOS transistors N25 through N28 may be commonly connected to a repair discrimination signal PRREB line. The output signals from the repair address check circuits R21 through R24 may be applied to gates of the second pull-down NMOS transistors N25 through N28, respectively.

In this example, a load of the block selection enable signal ENB line may be designed so as to be the same or substantially the same as a load of the repair discrimination signal PRREB line. To do so, a size of the first pull-down NMOS transistors N21 through N24, which are commonly connected to the block selection enable signal ENB line, may be designed so as to be the same or substantially the same size as the second pull-down NMOS transistors N25 through N28 commonly connected to the repair discrimination signal PRREB line.

Each of the first AND gates A21 through A24 may receive a corresponding one of output signals BS1 through BSn from the block decoders B21 through B24, and receive an inverted version of the block selection enable signal ENB. The second AND gates A25 through A28 may receive one of output signals BS1 through BSn from a corresponding one of the first AND gates A21 through A24. Each of the second AND gates A25 through A28 may also receive the repair discrimination signal PRREB. Each of the second AND gates A25 through A28 may output a corresponding one of block selection signals BS11 through BS1n based on a received output signal BS1 through BSn and the repair discrimination signal PRREB.

In one example, when the block selection address BDRA and the word line selection address WDRA are input, the control signal A (the output signal of the dummy repair address check circuit D21) is always enabled (e.g., set at a logic high), regardless of whether the input block selection address BDRA and the word line selection address WDRA are repair addresses or not. Accordingly, the first pull-down NMOS transistor N24 may be turned-on (active) so that the block selection enable signal ENB is deactivated (e.g., becomes logic low). In this example, each of the first AND gates A21 through A24 may receive the output signals from a corresponding one of the block decoders B21 through B24, and output the received output signals as output signals BS1 through BSn.

If the block selection address BDRA and the word line selection address WDRA are not repair addresses, the output signals of the repair address check circuits R21 through R24 are deactivated (e.g., set to logic low). Accordingly, all of the second pull-down NMOS transistors N25 through N28 may be turned-off, and the repair discrimination signal PRREB remains active (e.g., at a logic high; the repair discrimination signal PRREB is initially pre-charged to logic high). Thus, the second AND gates A25 through A28 receive and output the output signals BS1 through BSn of the first AND gates A21 through A24 as the block selection signals BS11 through BS1n.

If the block selection address BDRA and the word line selection address WDRA are repair addresses, an output signal of at least one corresponding repair address check circuit from among the repair address check circuits R21 through R24 may be deactivated (e.g., become logic low). As a result, a corresponding second pull-down NMOS transistor from among the second pull-down NMOS transistors N25 through N28 may turn on, and the repair discrimination signal PRREB may be deactivated (e.g., set to logic low). If the repair discrimination signal PRREB is deactivated, the block selection signals BS11 through BS1n output from the second AND gates A25 through A28 may be deactivated (e.g., set to logic low), such that the deactivated repair discrimination signal PRREB is output as the repair block selection signal RBS for selecting a repair word line RWL.

The word line decoding circuit 210 may include word line decoders W21 through W24. Each of the word line decoders W21 through W24 may activate a corresponding word line from among word lines WL1 through WLn in response to a corresponding block selection signal from among the block selection signals BS11 through BS1n.

Figure 3:
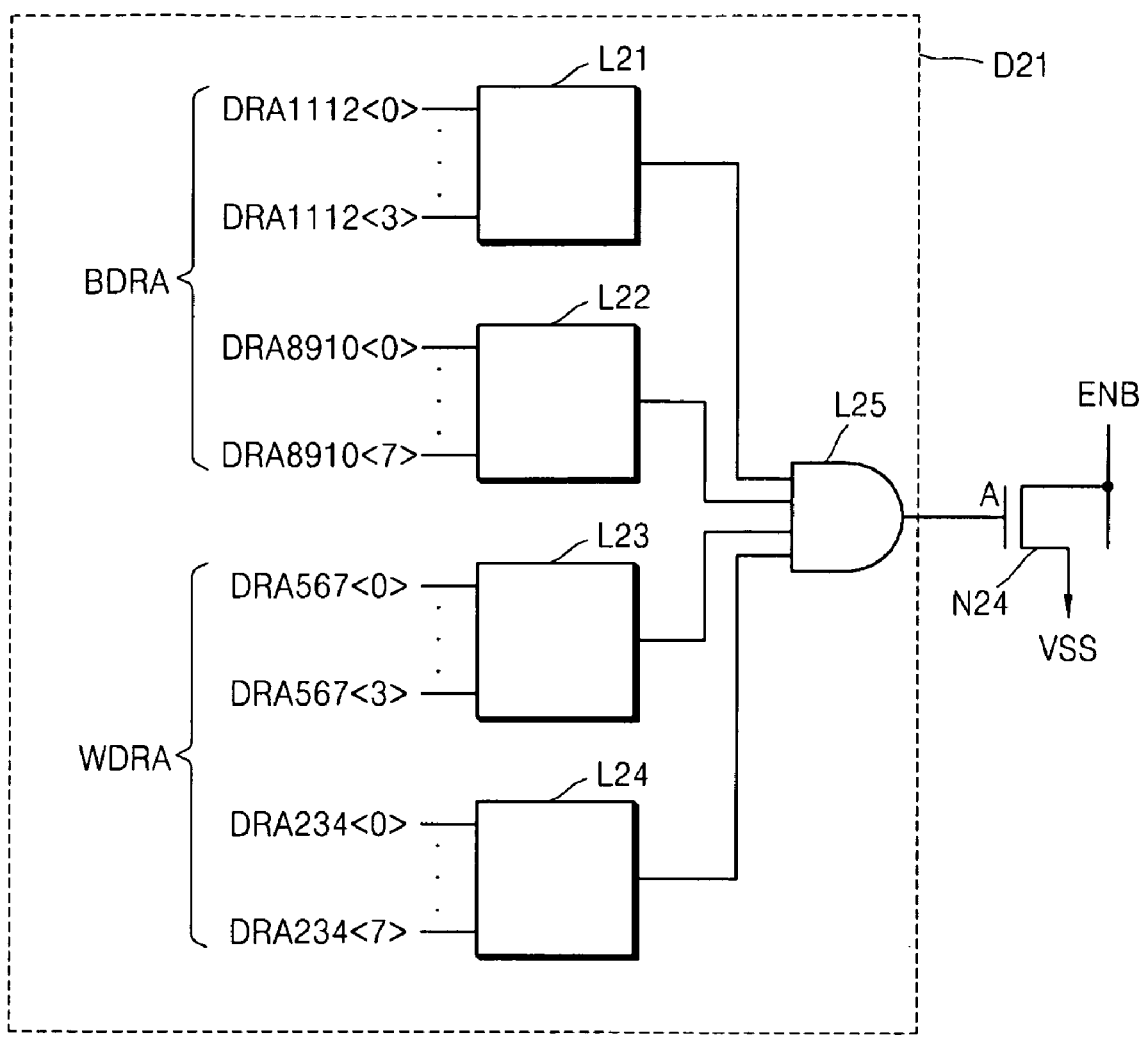
FIG. 3 is a diagram of a dummy repair address check circuit of FIG. 2 according to an example embodiment.

FIG. 3 is a diagram of an example embodiment of the dummy repair address check circuit D21 of FIG. 2.

Referring to FIG. 3, the dummy repair address check circuit D21 may include logic circuits L21 through L24, and an AND gate L25. The logic circuit L21 may receive addresses DRA1112<0> through DRA1112<3>, which correspond to the block selection address BDRA. The logic circuit L22 may receive addresses DRA8910<0> through DRA8910<7>, which also correspond to the block selection address BDRA. The logic circuit L23 may receive addresses DRA567<0> through DRA567<3>, which correspond to the word line selection address WDRA. The logic circuit L24 may receive addresses DRA234<0> through DRA234<7>, which also correspond to the word line selection address WDRA. The AND gate L25 may perform a logical AND operation with respect to output signals of the logic circuits L21 through L24 to generate the control signal A.

The dummy repair address check circuit D21 may be configured so as to enable the control signal A at logic high only when all of the block selection address BDRA and the word line selection address WDRA are input. The logic circuits L21 through L24 may be formed to be as similar as possible, for example, the same or substantially the same as the repair address check circuits R21 through R24.

As described above, in block decoding circuits according example embodiments the dummy repair address check circuits performing the same or substantially the same function as conventional delayers may be formed to be as similar as possible, for example, the same or substantially the same as the repair address check circuits so that delay characteristics are similar or substantially similar. Also, the dummy repair address check circuit may be disposed in the vicinity of (near) the last repair address check circuit, which is connected at a position that is further than other repair address check circuit from a point at which the block selection address and the word line selection address are input. In addition, a load of the block selection enable signal line may be designed so as to be the same or substantially the same as a load of the repair discrimination signal line.

Accordingly, in block decoding circuits according to example embodiments, the effects of delay characteristic mismatch may be reduced so that block selection signals may be generated normally without malfunction. Also, block decoding circuits according to example embodiments need not use conventional delayers, so that chip size may be reduced.

While the present invention has been particularly shown and described with reference to example embodiments thereof, it will be understood by those of ordinary skill in the art that various changes in form and details may be made therein without departing from the spirit and scope of the present invention as defined by the appended claims. The example embodiments should be considered in a descriptive sense only and not for purposes of limitation. Therefore, the scope of the present invention is defined not by the detailed description of the present invention but by the appended claims, and all differences within the scope will be construed as being included in the present invention.

What is claimed is:

1. A block decoding circuit of a semiconductor memory device, the block decoding circuit comprising:
    a plurality of block decoders, each of the plurality of block decoders being configured to decode a received block selection address and generate a first output signal corresponding to the received block selection address;
    a plurality of repair address check circuits, each of the plurality of repair address check circuits being configured to generate a second output signal based on whether the received block selection address and a word line selection address are repair addresses;
    a dummy repair address check circuit configured to generate a control signal in response to the received block selection address and the word line selection address; and
    a block selection signal generation circuit configured to generate block selection signals based on the first output signals from the plurality of block decoders, the control signal from the dummy repair address check circuit, and the second output signals from the plurality of repair address check circuits.

2. The block decoding circuit of claim 1, wherein the dummy repair address check circuit has a structure that is the same as a structure of the plurality of repair address check circuits.

3. The block decoding circuit of claim 1, wherein the dummy repair address check circuit activates the control signal regardless of whether the received block selection address and the word line selection address are repair addresses.

4. The block decoding circuit of claim 1, wherein the dummy repair address check circuit is arranged closer to a repair address check circuit located at a position that is furthest from a point at which the received block selection address and the word line selection address are input.

5. The block decoding circuit of claim 1, wherein each of the repair address check circuits disables the second output signal when the received block selection address and the word line selection address are not repair addresses, and enables the second output signal when the received block selection address and the word line selection address are repair addresses.

6. The block decoding circuit of claim 5, wherein the block selection signal generation circuit activates the block selection signals and deactivates a repair block selection signal when the received block selection address and the word line selection address are not repair addresses.

7. The block decoding circuit of claim 5, wherein the block selection signal generation circuit deactivates the block selection signals and activates a repair block selection signal for selecting a repair word line in response to an enabled second output signal from the repair address check circuits when the received block selection address and the word line selection address are repair addresses.

8. The block decoding circuit of claim 1, wherein the block selection signal generation circuit includes,
    a first transistor having a drain connected to a block selection enable signal line and a gate to which the control signal is applied,
    a plurality of first logic gates, each of the plurality of first logic gates receiving a corresponding one of the first output signals, and receiving an inverted block selection enable signal,
    a plurality of second transistors, each of the plurality of second transistor having a drain connected to a repair discrimination signal line, having a gate to which a corresponding second output signal is applied, and having a source connected to a ground voltage, and
    a plurality of second logic gates, each of the plurality of second logic gates generating a block selection signal based on an output signal from a corresponding one of the first logic gates and a repair discrimination signal.

9. The block decoding circuit of claim 8, wherein a load of the block selection enable signal line is substantially the same as a load of the repair discrimination signal line.

10. The block decoding circuit of claim 8, wherein the plurality of first logic circuits are AND circuits.

11. The block decoding circuit of claim 8, wherein the plurality of second logic circuits are AND circuits.

12. The block decoding circuit of claim 11, wherein, if the received block selection address and the word line selection address are repair addresses, the block selection signal generation circuit is further configured to, deactivate the block selection signals, and select a repair word line.

13. The block decoding circuit of claim 12, wherein the block selection signal generation circuit selects the repair word line by activating a repair block selection signal input to the repair word line.

14. A method of operating a block decoding circuit of a semiconductor memory device, the method comprising:
    decoding, at each of a plurality of block decoders, a received block selection address and generating a first output signal corresponding to the received block selection address;
    generating, at each of a plurality of repair address check circuits, a second output signal based on whether a received block selection address and a word line selection address are repair addresses;
    generating, at a dummy repair address check circuit, a control signal in response to the received block selection address and the word line selection address; and
    generating, at a block selection signal generation circuit, block selection signals based on the first output signals from the plurality of block decoders, the control signal from the dummy repair address check circuit, and the second output signals from the plurality of repair address check circuits.

15. The method of claim 14, wherein the control signal is activated regardless of whether the received block selection address and the word line selection address are repair addresses.

16. The method of claim 14, wherein each of the second output signals is disabled when the received block selection address and the word line selection address are not repair addresses, and is enabled when the received block selection address and the word line selection address are repair addresses.

17. The method of claim 16, wherein the block selection signals are activated and a repair block selection signal is deactivated when the received block selection address and the word line selection address are not repair addresses.

18. The method of claim 16, wherein the block selection signals are deactivated and a repair block selection signal for selecting a repair word line is activated in response to an enabled second output signal from the repair address check circuits when the received block selection address and the word line selection address are repair addresses.

19. The method of claim 14, further comprising:
deactivating the block selection signals; and selecting a repair word line if the received block selection address and the word line selection address are repair addresses.

20. The method of claim 19, wherein the selecting further includes,
activating a repair block selection signal input to the repair word line.

* * * * *